US005660632A

United States Patent [19]
Volpe, Jr. et al.

[11] Patent Number: 5,660,632
[45] Date of Patent: Aug. 26, 1997

[54] APPARATUS FOR SPREADING MATERIAL ONTO A SUBSTRATE

[75] Inventors: John Joseph Volpe, Jr., Milford; John Joseph Volpe, III, Blackstone; Gail Kathryn Howe, Milford; Robert Jeffrey Enterkin, Bolton, all of Mass.

[73] Assignee: JNJ Industries, Inc., Milford, Mass.

[21] Appl. No.: 572,971

[22] Filed: Dec. 15, 1995

[51] Int. Cl.⁶ .................................................. B05C 21/00
[52] U.S. Cl. .......................... 118/213; 118/406; 101/114; 101/120; 101/121; 101/123; 15/245; 15/245.1
[58] Field of Search .................................. 118/213, 301, 118/406, 504; 101/114, 119, 120, 121, 123; 427/272, 282; 15/245, 245.1, 256.53

[56] References Cited

U.S. PATENT DOCUMENTS

| | | | |
|---|---|---|---|
| 3,943,849 | 3/1976 | Vasilantone | 101/123 |
| 4,122,771 | 10/1978 | Barton et al. | 101/123 |
| 4,648,317 | 3/1987 | Bubley et al. | 101/123 |
| 4,995,316 | 2/1991 | Kölblin et al. | 101/114 |
| 5,101,530 | 4/1992 | Hansen et al. | 15/245 |
| 5,321,868 | 6/1994 | Coulson et al. | 101/114 |
| 5,345,862 | 9/1994 | Giard | 101/123 |
| 5,357,857 | 10/1994 | Zimmer | 101/119 |
| 5,458,060 | 10/1995 | Casl | 101/120 |
| 5,479,854 | 1/1996 | Chikahisa et al. | 101/123 |

*Primary Examiner*—Laura Edwards
*Attorney, Agent, or Firm*—George C. Atwell

[57] ABSTRACT

An apparatus for spreading and depositing a viscous liquid or paste-like material on a substrate includes a housing removably insertable into a diamond- or square-shaped squeegee blade holder, the blade holder itself mounted to a squeegee head assembly of a screen or stencil printer. The squeegee head assembly is driven in a linear direction over and above the substrate, dragging the blade over the substrate and forcing deposition of the material onto the substrate. The housing includes a pair of oppositely-disposed locking clamps that attach to both ends of the housing. A shaft having a blade secured thereto is disposed through the channels of the clamps and within a groove of the housing, and the shaft is rotatable within the housing and the locking clamps so that the angle of attack between the blade and substrate can be selectively adjusted and, once the appropriate angle of application is selected, the blade is fixed in position by tightening the clamps against the shaft.

5 Claims, 3 Drawing Sheets

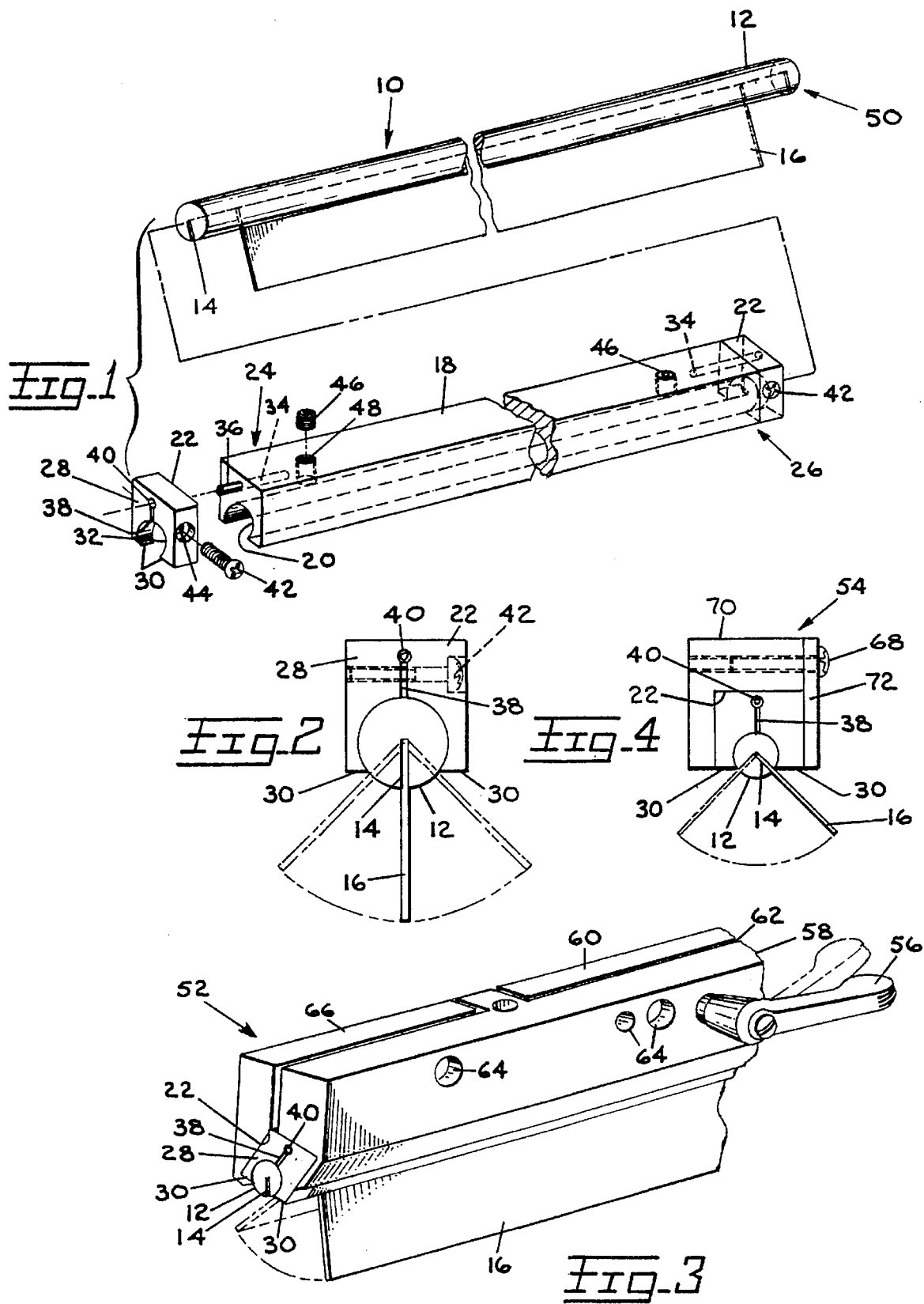

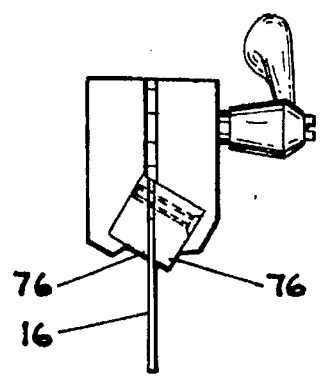 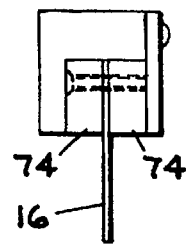 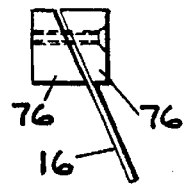
Fig. 14  Fig. 12  Fig. 13
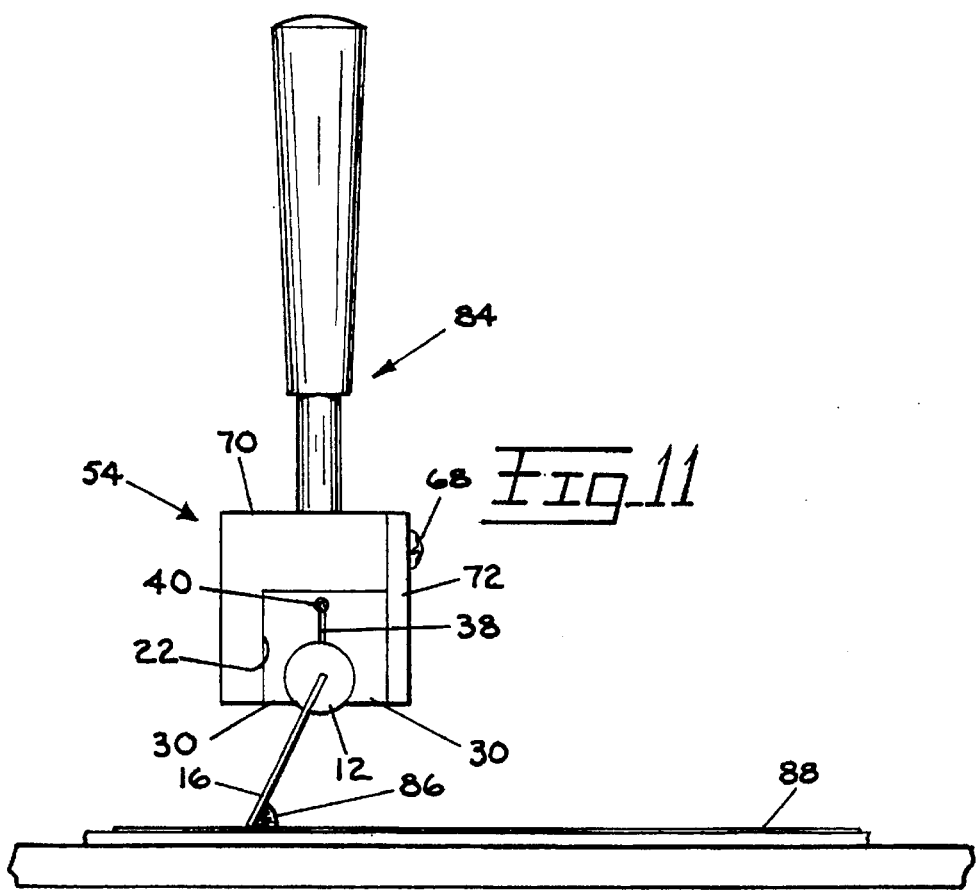
Fig. 11

APPARATUS FOR SPREADING MATERIAL ONTO A SUBSTRATE

BACKGROUND OF THE INVENTION

The present invention comprehends an apparatus for spreading and pushing material onto a substrate, and more particularly pertains to an adjustable blade for spreading a viscous liquid or paste-like material onto printed circuit boards and other substrates.

In the surface mount technology field and hybrid microelectronics field, manual, semi-automatic, or automatic screen and stencil printing equipment is typically used for printing solder paste, epoxies (both conductive and adhesive), conductive inks, resistive inks, and dielectric inks, for example, onto printed circuit boards and other substrates.

The circuit board, or other substrate, is placed on the stencil or screen printer, and then one of the abovementioned materials is printed onto the circuit board through either a metal mask stencil with open apertures or through a template having a plurality of interstices. In addition, the materials can be printed onto a circuit board through a cross-sectional screen mesh that has an emulsion in it, and the circuit or pattern to be printed on the circuit board is etched out of the emulsion. The various above-described materials are used for the purpose of attaching electrical components to the substrate and for manufacturing electrical circuits on the substrate.

The typical screen or stencil printer includes a tooling plate upon which the circuit board is positioned and aligned, a squeegee assembly or squeegee head assembly, and a metal or polyurethane blade referred to in the industry as a "squeegee blade". A squeegee blade holder is mounted to the squeegee assembly, and both the squeegee blade holder and squeegee assembly are positioned above and extend transverse to the circuit board or other substrate horizontally positioned on the tooling plate which is part of the screen or stencil printer.

A squeegee blade is inserted into the squeegee blade holder so that the squeegee blade is superjacent the circuit board and extends transverse thereto. The squeegee head assembly is driven over the screen, stencil, or template positioned between the circuit board and the downwardly-projecting squeegee blade by some type of electric or pneumatic motor or cylinder drive assembly. This movement is referred to as the "squeegee stroke". For most printers the squeegee head assembly can print in both directions (forward or backward), and the movement of each stroke can be individually controlled. In addition, many screen and stencil printers permit x, y, and theta (rotation) adjustments of the circuit board or other substrate placed on the printer. Moreover, some types of printers include features which permit adjustment of both the speed and stroke length of the squeegee head assembly and adjustment of the pressure of the squeegee blade against the material and/or substrate. Metal squeegee blades are typically used in place of polyurethane squeegee blades when a company is printing high viscosity materials, such as solder paste or epoxy, onto printed circuit boards or other substrates.

In operation, the squeegee blade is driven down under pressure until it comes into contact with, or is just above, the top surface of the screen or stencil. With the squeegee blade forced down under pressure, the drive assembly drags the squeegee blade across the stencil. As the squeegee blade travels above the stencil, the solder paste—or other material previously described—is dragged and pushed along the top surface of the stencil by the squeegee blade. The simultaneous downward pressure and forward travel of the squeegee blade against the solder paste forces the paste through the stencil or screen and deposits the solder paste onto the circuit board. The downward pressure and longitudinal movement of the blade forces the solder paste through the stencil or screen apertures and, in the process, wipes clean the surface of the screen or stencil. The bead of solder paste is not dragged across the top surface of the screen or stencil; in fact, the bead of solder paste rolls across the top surface of the screen or stencil like a steam roller traveling over a road surface. The rolling action of the solder paste caused by the downward pressure and forward movement of the squeegee blade is what causes the paste to be pushed and passed through the screen or stencil apertures for deposition onto the circuit board. Once the solder paste is forced through the interstices of the template or the apertures of the stencil, capacitators, resistors, and other electrical components are mounted onto the wet paste deposited on the circuit board to complete the electrical circuitry of the board. Then the circuit board goes through a heating/curing process and the solder paste is transformed into what in the art is called pads and lines which create the electrical circuitry on the circuit board.

Among the critical factors which affect the passing of solder paste through the screen or stencil apertures and deposition of solder paste onto the circuit board is the angle at which the squeegee blade meets the top surface of the screen or stencil. This is referred to in the industry as the "angle of attack". Varying this angle affects the amount of solder paste or other material deposited through the screen or stencil apertures and onto the substrate surface.

The majority of metal squeegee blades currently in use comprise two flat, elongated, aluminum or steel plates between which a flat or bent piece of steel (the actual squeegee blade) is sandwiched. The plates are fastened together to hold the blade in position. This sandwich blade assembly is then inserted into a squeegee holder. The result is a metal squeegee blade whose angle of attack is fixed relative to the stencil or screen over which the blade will pass during the printing process. An alternative is to cut two elongated blocks of steel or aluminum at an angle so that the blade located therebetween is sandwiched at an angle. Moreover, some screen and stencil printers include a feature which permits adjustment of the entire squeegee head assembly so that the angle of attack can be varied. However, this feature is usually not standard on printers but comes as an option and is a separate mechanism from the blade.

Therefore, there is a need for a squeegee blade which incorporates an adjustable "angle of attack" in its design, and is readily adaptable to the various squeegee blade holders and squeegee head assemblies in use in the surface mount technology field.

SUMMARY OF THE INVENTION

The present invention comprehends an apparatus for spreading and depositing material on a substrate and includes an elongated, square-shaped squeegee housing which is removably insertable in a blade holder. The blade holder is part of a squeegee head assembly which is located above and extends transverse to the substrate. The housing includes a circular-shaped groove coequal in length with the housing. A pair of oppositely-disposed, arch-shaped locking clamps are removably attachable to either end of the housing. Each clamp has a main body portion and a pair of oppositely-disposed, inwardly-curving legs which define a circular channel. Protruding horizontally from each end of the housing is a roll pin, and the locking clamps are attached to the housing ends by insertion on the roll pins. When the locking clamps are attached to the housing, the circular groove of the housing is axially aligned with the circular channels of the clamps.

Disposed within the channels of the clamps and groove of the housing is an elongated, cylindrical shaft. The shaft has a longitudinal slot formed on its surface which is coequal in length with the shaft. The shaft is capable of rotatable movement within the channels of the clamps and the groove of the housing. Mounted within the slot of the shaft and rotating concomitant with the shaft is an elongated blade which can either be shorter than the slot or may be coequal in length with the shaft. The blade can be selectively adjusted within a predetermined number of degrees by rotating the shaft within the housing so that the proper angle of attack can be obtained. Once the proper angle between the blade and substrate is obtained, the legs of the clamps are tightened against the shaft and this fixes and holds the shaft within the housing so that the shaft does not rotate. Thus, the angle of attack of the blade with respect to the substrate is also fixed. By loosening a screw that is inserted through the main body portion of each clamp and against the ends of the shaft, the shaft can be rotated within the housing and the angle of attack of the blade can be selectively adjusted relative to the substrate.

It is an objective of the present invention to provide an apparatus which allows adjustment of the angle of attack of the blade after the blade and shaft have been mounted to the blade holder, and after the blade holder has been inserted into a squeegee head assembly.

Another objective of the present invention is to provide an adjustable blade which is insertable within diamond- or square-shaped blade holders and also can be used on trailing-edge-style holders.

These and other objects and advantages will be readily evident upon a study of the following specification and accompanying drawings wherein:

BRIEF DESCRIPTION OF THE DRAWINGS

FIG. 1 is an exploded isometric view of the apparatus of the present invention;

FIG. 2 is a side elevational view of the apparatus first shown in FIG. 1;

FIG. 3 is an isometric view of the apparatus first shown in FIG. 1 illustrating the apparatus disposed within a diamond-shaped blade holder;

FIG. 4 is a side elevational view of the apparatus first shown in FIG. 1 illustrating the disposition of the apparatus within a square-shaped blade holder;

FIG. 11 is a side elevational view of the apparatus first shown in FIG. 1 illustrating the disposition of the apparatus within a squeegee head assembly;

FIG. 12 is a side elevational view of a prior art blade and shaft disposed within a square-shaped blade holder;

FIG. 13 is a side elevational view of the prior art illustrating the angled disposition of the blade; and FIG. 14 is a side elevational view of the prior art blade and shaft first shown in FIG. 13 illustrating the disposition of this blade and shaft within a diamond-shaped blade holder.

DETAILED DESCRIPTION OF THE PREFERRED EMBODIMENT

Figure 5:
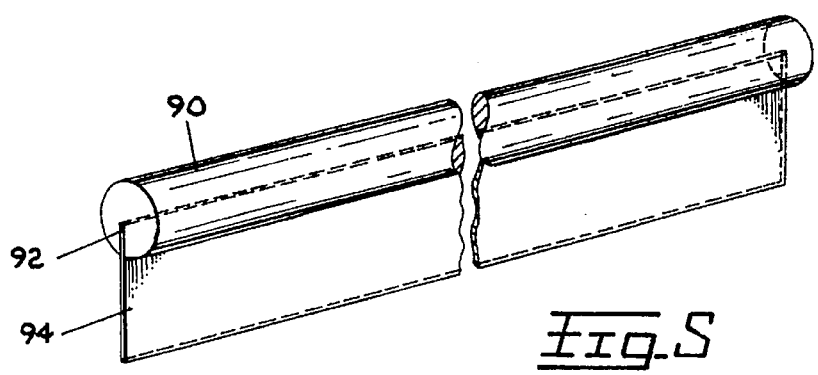
FIG. 5 is an isometric view of an alternative embodiment to the apparatus first shown in FIG. 1.

Illustrated in FIGS. 1–11 is an apparatus 10 for spreading a variety of materials onto a substrate; and the apparatus 10 is adapted for removable insertion into the channel or open area of either a diamond-shaped or square-shaped squeegee blade holder which, in turn, is mounted to and part of a squeegee head assembly. The squeegee head assembly travels over a screen, stencil, or template superposed on a circuit board or other substrate which is supported on a base or tooling plate on any of a variety of manual, automatic, and semi-automatic screen and stencil printers. A spreading means securable to the apparatus 10 forces solder paste or other material through the apertures of the stencil, the interstices of the template, or the mesh of the screen, and onto the circuit board for the purpose of attaching electrical components and for manufacturing electrical circuits on the circuit board.

Shown in FIGS. 1–4 and 11 is an elongated, cylindrical shaft 12 having a milled groove or slot 14 formed therein and extending coequal in length with the shaft 12. The slot 14 extends one-half the distance into the diameter of the shaft 12. The length of the shaft 12 can vary to accommodate the enormous variety of circuit board sizes and image areas to be printed by screen and stencil printers. One common shaft diameter is 0.187 inches.

Illustrated in FIGS. 1–4 and 11 is a blade 16 which may be referred to as a squeegee blade, a metal squeegee blade, or a metal blade. If the squeegee blade is metal, the blade is typically manufactured from a spring steel or stainless steel so that the metal blade can be plated with a special coating that will provide a non-stick surface. However, the blade 16 can be manufactured from a plastic material, such as polyurethane; but when high viscosity materials, such as solder paste or epoxies, are to be printed onto circuit boards, the metal blade is used. The thickness of the blade 16 ranges between 0.00010 and 0.00020 of an inch. In FIGS. 1–4 and 11, the blade 16 is inserted into the slot 14 of the shaft 12 so that the blade 16 and shaft 12, which are separate elements, become a one-piece unit or assembly through the manufacturing process. The blade 16 is mounted to the slot 14 and secured thereto by an epoxy. In FIGS. 1–4 and 11, the blade 16 is not as long as the shaft 12 but the extension of the blade 16 within the slot 14 can vary for each particular use as shall be hereinafter further described. With the blade 16 inserted into the slot 14 and permanently affixed to the shaft 12 by an epoxy, any rotation or rotatable movement by the shaft 12 causes the blade 16 to rotate concomitant therewith.

Shown in FIGS. 1, 3, 4, and 11 is an elongated, adjustable angle, blade shaft housing 18 having a generally circular-shaped groove 20 extending therethrough and which is coequal in length with the housing 18. The housing 18 also includes a locking means for fixing the angle of attack of the blade 16 and for preventing movement and rotation of the shaft 12 within the housing 18. The locking means includes a pair of oppositely-disposed, arch-shaped locking clamps 22, shown in FIGS. 1–4 and 11, which are removably attachable to either end 24 and 26 of the housing 18. Each clamp 22 includes a main body portion 28 and oppositely-disposed, downwardly-projecting legs 30 which form a generally circular-shaped aperture or channel 32. On each flat end surface at each opposite end 24 and 26 of the housing 18 is a blind hole 34 which is spaced slightly above the groove 20 of the housing 18. Inserted into each blind hole 34 is a dowel or roll pin 36 such that a portion of the pin 36 projects outwardly from each end surface perpendicular thereto. Cut into the main body portion 28 of each clamp 22, and extending upwardly from the top of the channel 32, is a slight gap 38 which also spaces the legs 30 from each other. The gap 38 terminates at a circular receiving or mounting hole 40 which extends through the main body portion 28 of each clamp 22.

As shown in FIG. 1, in order to mount the clamps 22 to the ends 24 and 26 of the housing 18, the roll pins 36 are first inserted into the blind holes 34 and then each clamp 22 is slipped onto the respective pin 36 by the hole 40. The shaft 12 is then inserted into and through the channel 32 of one clamp 22 and through the length of the groove 20 of the housing 18 until the shaft 12 is received into the channel 32 of the opposite clamp 22. There is a very slight gap or clearance between the shaft 14 and the inner surface of the groove 20. Once this insertion is completed, the shaft 12 is axially aligned and enclosed within the channels 32 and the groove 20. The housing 18 can then be mounted to the squeegee head assembly.

The shaft 12 is freely rotatable within the housing 18, and in order to prevent the rotation of the shaft 12 and fix the angle of application of the blade 16 with respect to the substrate over which it will pass, a screw 42 is inserted into a threaded aperture 44 which extends transversely through the main body portion 28 of each clamp 22. With the shaft 12 inserted through the clamps 22 and into and through the housing 18, tightening each screw 42 inserted in each aperture 44 causes the slight gap 38 in each clamp 22 to close, bringing the legs 30 together, compressing and pinching the legs 30 against the cylindrical surface of the shaft 12. This prevents rotation of the shaft 12 and fixes the shaft 12 within the housing 18. Both screws 42 must be tightened within the clamps 22 for properly compressing the legs 30 against the shaft 12 so that rotation of the shaft 12 within the housing 18 is prohibited. It should be noted that the housing 18 itself does not pinch or in any way compress the cylindrical surface of the shaft 12; all that is necessary in order to prevent rotation of the shaft 12 and fix the angle of application of the blade 16 is for the legs 30 to be brought together and tightly compress and pinch against the end portions of the shaft 12. Loosening each screw 42 causes the legs 30 to slightly move away from each other and release their grip upon the end portions of the shaft 12. In order to provide backup for the clamps 22, a pair of set screws 46, shown in FIG. 1, can be inserted through threaded apertures 48 extending from the upper surface of the housing 18 and registering with the groove 20 itself. The apertures 48 are adjacent the blind hole 34 for each roll pin 36, and inserting and tightening the screws 46 therein causes the screws 46 to contact the shaft 12 to further prevent the shaft 12 from rotating in the housing 18.

The shaft 12 and blade 16 of FIG. 1 are removably insertable into the housing 18 of FIG. 1, and create an assembly 50 which is removably insertable into either a diamond-shaped blade holder 52, as shown in FIG. 3, or a square-shaped blade holder 54, as shown in FIG. 4. FIG. 2 illustrates one screw 42 completely inserted into the clamp 22 which causes the legs 30 to compress and contact the shaft 12 for preventing rotation of the shaft 12 and fixing the angle of the blade 16 relative to the substrate. The holders 52 and 54 shown in FIGS. 3 and 4 have a relatively simple method of holding the housing 18 therein. With the housing 18 inserted into the holder 52 of FIG. 3, a lever 56 which extends through a main block portion 58 and into and through a second block portion 60 is turned so that the second block portion 60 is drawn toward the main block portion 58. This closes down a clearance space 62 between the two block portions 58 and 60 and causes the second block portion 60 to compress and pinch against the housing 18 which holds the housing 18 in place within the holder 52. Roll pins or dowels (not shown) are inserted through apertures 64 on the face of the main block portion 58 and into both the second block portion 60 and a third block portion 66 for maintaining alignment of the block portions 58, 60, and 66. The square-shaped holder 54 of FIG. 4 employs essentially the same elements to hold and contain the housing 18 therein. Tightening one or several fasteners 68 which extend transversely through the holder 54 of FIG. 4 causes an L-shaped portion 70 of the holder 54 and a vertical portion 72 to draw and compress against each other. Tightening the fasteners 68 thus compresses the housing 18 within the L-shaped portion 70 and the vertical portion 72 of the holder 54 and thus maintains the housing 18 within this holder 54.

The particular angle of attack of the blade 16 can be pre-set outside any particular holder or the blade 16 can be adjusted after the blade 16 is inserted into the holder, such as holders 52 and 54. This provides maximum flexibility for the blade 16 to achieve the appropriate angle of attack.

Figure 10:
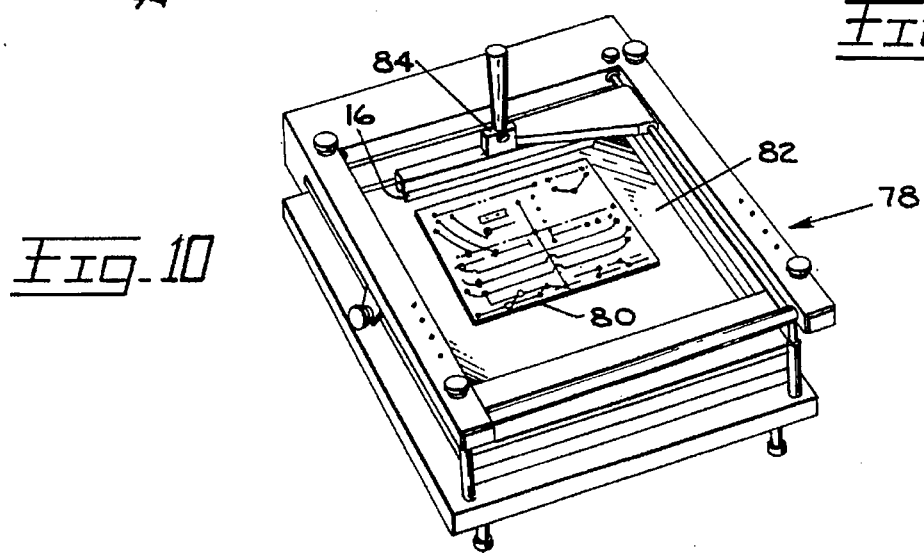
FIG. 10 is an isometric view of the apparatus mounted to a squeegee assembly of a screen printer.

In addition to the assembly 50 of the present invention being removably insertable into a variety of blade holders, such as are shown in FIGS. 3 and 4, the adjustable angle of application of the blade 16 represents a significant improvement over the prior art. Illustrated in FIGS. 12–14 is the prior art. Currently, an elongated piece of steel or aluminum is cut longitudinally into two flat pieces of aluminum or steel plate 74. The squeegee blade, whether metal or non-metal, is then fastened between the plates 74 like a sandwich. Once the plates 74 are fastened together, the angle of attack of the blade 16 is permanently fixed. Furthermore, it is possible to cut an aluminum or steel block 76 at an angle so that the blade 16 is placed or sandwiched between two blocks 76 at an angle; but even in this embodiment, as shown in FIGS. 13 and 14, once the blocks 76 are fastened together, the angle of attack of the blade 16 is fixed in place and non-adjustable. If the zero position is taken to be the position when the blade 16, as shown in FIG. 3, is perpendicular to the substrate, whether it be a screen, stencil, or template, then typical angles of attack for blades currently in use range from between 38° and 42°. In contrast, the range of adjustment of the assembly 50 is much greater which permits a much more accurate and closer control of the amount of solder paste or other material deposited on the circuit board. From the zero position, the blade 16 shown in FIGS. 1–4 has a range of adjustment within the housing 18 of ±70°. Hence, the total range of adjustment for the blade 16 illustrated in FIGS. 1–4 is from 20° to 160°, with the zero position being at FIG. 90°. FIG. 10 illustrates a representative screen printer 78 with a circuit board 80 resting upon a tooling plate 82 and a squeegee head assembly 84 adjacent the board 80. A blade 16 projects downwardly at an angle ready to sweep over the board 80 and stencil (not shown). FIG. 11 illustrates one possible angle of application of the blade 16 with regard to the solder paste 86, stencil 88, and circuit board 80.

Figures 6, 7, 9:
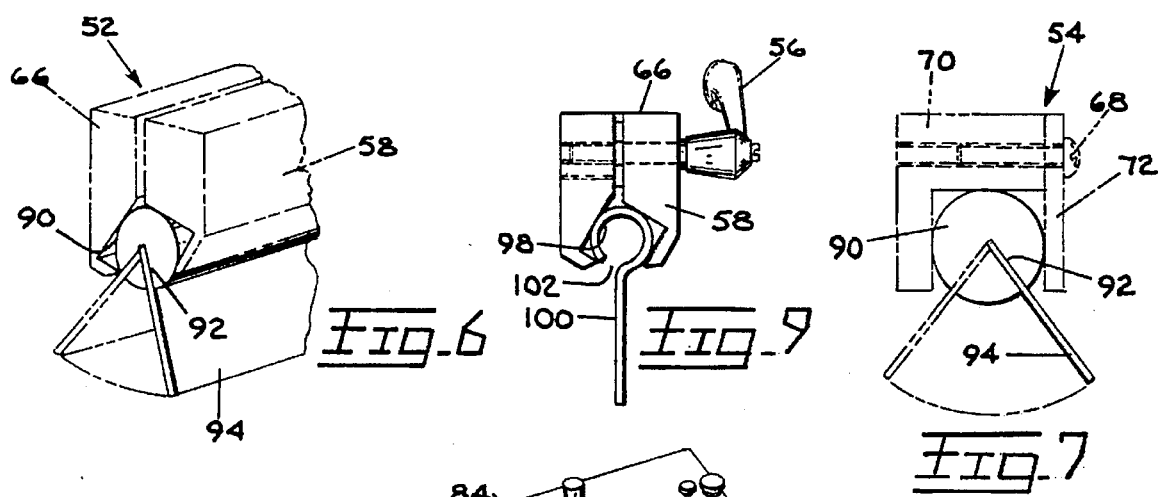
FIG. 6 is an enlarged fragmentary view of the apparatus first show in FIG. 5 illustrating the disposition of the apparatus within a diamond-shaped blade holder.
FIG. 7 is a side elevational view of the apparatus first shown in FIG. 6, illustrating the disposition of the apparatus within a square-shaped blade holder.
FIG. 9 is a side elevational view of the apparatus first shown in FIG. 7 illustrating the disposition of the apparatus within a diamond-shaped blade holder.

FIGS. 5–9 illustrate alternative embodiments for the blade and shaft assembly 50 shown in FIGS. 1–4. FIGS. 5–7 disclose a second alternate embodiment for the assembly 50 shown in FIGS. 1–4. FIGS. 5–7 disclose an elongated, cylindrical shaft 90 having a milled groove or slot 92 cut longitudinally along its length and extending approximately halfway into the shaft 90. A blade 94 is mounted into the slot 92 and is permanently secured thereto by the use of an epoxy. The two major differences between the shaft 90 and blade 94 of FIGS. 5–7 and the shaft and blade illustrated in FIGS. 1–4 are that in FIGS. 5–7 the blade 94 is coextensive in length with the shaft 90 and that the shaft 90 is enlarged to fill the area within the holders 52 and 54 of FIGS. 3 and 4 that would be filled by the housing 18 in the preferred embodiment. FIGS. 6 and 7 show the shaft 90 disposed within the square-shaped blade holder 54 and the diamond-shaped blade holder 52; and the diameter of the shaft 90 completely fills the area which would be filled by the housing 18 of FIG. 1 in the preferred embodiment. As shown in FIGS. 6 and 7, the shaft 90 is rotatable within the respective holders 52 and 54 for permitting the selective adjustment of the angle of attack of the blade 94. By manually adjusting the lever 56 as previously described in relation to FIG. 3, or tightening the fasteners 68 that extend transversely through the holder 54 as previously described with respect to FIG. 4, rotation of the shaft 90 is prevented and the angle of attack of the blade 94 is fixed relative to the substrate. As in the preferred embodiment, the angle of attack for the blade 94 is fixed before the holder 52 or 54 is mounted to the squeegee head assembly 84.

Figure 8:
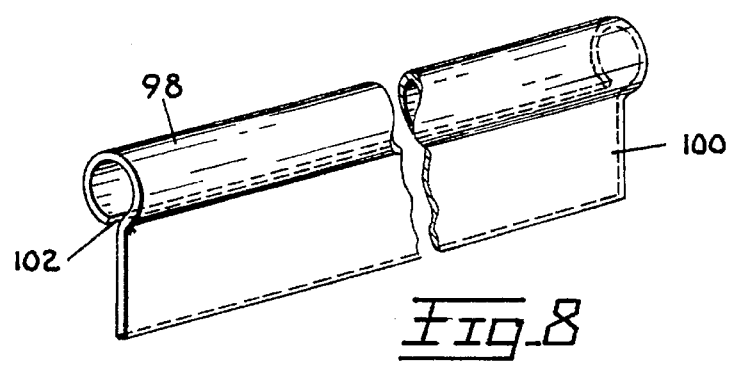
FIG. 8 is an isometric view of a second alternative embodiment to the apparatus first shown in FIG. 1.

Illustrated in FIGS. 8 and 9 is a third alternative embodiment for the assembly 50. In FIGS. 8 and 9 the squeegee blade is formed from an elongated sheet of steel or aluminum and is shaped in the form of an eye hook with an elongated, tubular-shaped shaft portion 98 and an integrally-formed flat blade portion 100. A longitudinal slot 102 coequal in length with the tubular-shaped shaft portion 98 spaces the upper portion of the blade 100 from the inwardly-curved edge of the tubular-shaped shaft portion 98 so that the shaft portion 98 does not form a closed circle along its axial length. The integral shaft 98 and blade 100 of FIGS. 5, 8, and 9 is disposed within the holder 52 in the same way that the enlarged shaft 90 embodiment of FIGS. 5–7 is disposed within the holders 52 and 54. FIG. 9 shows the shaft 98 and blade 100 inserted into the diamond-shaped holder 52, and this is the same holder 52 as shown in FIG. 3. The angle of the blade 100 in FIG. 9 is fixed relative to the substrate by manually tightening the lever 56 so that as the portions 58 and 60 of the holder 52 are brought together the tubular-shaped shaft portion 98 is compressed and thus held in place. The blade 100 illustrated in FIG. 9 can also be disposed within the square-shaped holder 54 illustrated in FIGS. 4 and 7, and it would be maintained within this holder 54 by simply tightening the transversely-extending fasteners 68 so that the holder 54 would compress and hold the tubular-shaped shaft portion 98 in a fixed, non-rotatable position which would fix the angle of attack of the blade 100.

Although several embodiments of the present invention have been illustrated and described, it will be apparent to those skilled in the art that various changes and modifications may be made therein without departing from the spirit of the invention or the scope of the appended claims.

We claim:

1. Apparatus for spreading a paste substance on a circuit board, comprising:

a housing having a groove extending therethrough and which is coequal in length with the housing;

an elongated shaft having a longitudinal slot coequal in length therewith and which is disposed within the groove for selective rotation therein;

an elongated blade mounted to the slot of the shaft and rotatable concomitant with the rotation of the shaft in order to adjust the angle between the blade and the circuit board;

a locking means attachable to the housing for fixing the angle of the blade relative to the circuit board;

the locking means including a pair of oppositely-disposed, arch-shaped locking clamps mountable to the ends of the housing so that the locking clamps can be selectively compressed against the shaft to prevent shaft rotation within the housing; and each locking clamp further including a main body portion and a pair of oppositely-disposed legs defining an aperture for receiving the shaft and the legs contacting the shaft for preventing shaft rotation within the housing.

2. Apparatus for pushing a paste substance through the apertures of a workpiece and onto a circuit board, comprising:

a housing having a groove extending therethrough and which is coequal in length with the housing;

a pair of oppositely-disposed, arch-shaped locking clamps mountable to both ends of the housing, and each clamp having a pair of opposed legs for defining a channel through which the shaft is inserted;

an elongated shaft having a longitudinal slot, the shaft disposed within the groove of the housing and channels of the clamps for selective rotation therein; and an elongated blade mounted within the slot and which rotates concomitant with the rotation of the shaft in order to selectively adjust the angle between the blade and the circuit board.

3. Apparatus for spreading a paste substance onto a circuit board, comprising:

a housing having a groove extending therethrough and which is coequal in length with the housing;

a pair of oppositely-disposed, arch-shaped locking clamps removably attachable to both ends of the housing and each clamp having a pair of opposed legs which define a channel;

spreading means for spreading the paste substance onto the circuit board, the spreading means inserted into the groove of the housing and the channels of the locking clamps for selective rotational movement therein to vary the angle between the spreading means and the circuit board; and a means to tighten the legs of the clamps which is securable to the locking clamps for fixing the angle between the spreading means and the substrate.

4. Apparatus for spreading a paste substance on a circuit board, comprising:

an elongated blade holder having a channel coequal in length therewith;

an elongated shaft having a longitudinal slot coequal in length therewith, the shaft completely enclosed within the channel for selective rotatable movement therein;

an elongated blade mounted to the shaft for rotation concomitant with the shaft rotation, the blade projecting downwardly at a predetermined angle to the circuit board when the shaft is disposed within the channel of the blade holder; and means to fix the angle of the blade relative to the circuit board which extends within the blade holder for compressing the blade holder against the shaft.

5. Apparatus for spreading a paste substance on a circuit board, comprising:

an elongated blade holder having a channel coequal in length therewith;

an elongated, tubular-shaped shaft for removable insertion within the channel of the blade holder and disposed for selective rotatable movement therein;

the shaft having a longitudinal slot coequal in length with the shaft so that the shaft does not form a closed circle along the axial length of the shaft;

an elongated blade formed from the shaft and projecting away from the shaft axis and toward the circuit board;

the blade rotatable concomitant with the rotation of the shaft so that the angle between the blade and the circuit board can be adjusted; and means to fix the angle of the blade relative to the circuit board which extends through the blade holder for compressing the blade holder against the shaft.

* * * * *